United States Patent
Hyun et al.

(10) Patent No.: US 11,409,401 B2
(45) Date of Patent: Aug. 9, 2022

(54) TOUCH SENSOR AND DISPLAY DEVICE HAVING THE SAME

(71) Applicant: SAMSUNG DISPLAY CO., LTD., Yongin-si (KR)

(72) Inventors: Chang Ho Hyun, Yongin-si (KR); Geun Yeong Chang, Yongin-si (KR); Man Bok Cheon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/198,095

(22) Filed: Mar. 10, 2021

(65) Prior Publication Data
US 2022/0004281 A1 Jan. 6, 2022

(30) Foreign Application Priority Data

Jul. 3, 2020 (KR) .................. 10-2020-0082315

(51) Int. Cl.
*G06F 3/044* (2006.01)
*G06F 3/041* (2006.01)
*H01L 27/32* (2006.01)

(52) U.S. Cl.
CPC .......... *G06F 3/0446* (2019.05); *G06F 3/0412* (2013.01); *G06F 3/0443* (2019.05); *G06F 3/04164* (2019.05); *H01L 27/323* (2013.01)

(58) Field of Classification Search
CPC ............... G06F 3/0412; G06F 3/04164; G06F 3/04166; G06F 3/0446; G06F 2203/04803; H01L 27/32

See application file for complete search history.

(56) References Cited

U.S. PATENT DOCUMENTS

| 6,825,833 | B2 | 11/2004 | Mulligan et al. |
| 8,947,392 | B2 | 2/2015 | Long et al. |
| 10,061,452 | B2 | 8/2018 | Kim |
| 2010/0253638 | A1 | 10/2010 | Yousefpor et al. |
| 2011/0148435 | A1 | 6/2011 | Schwartz et al. |
| 2015/0022494 | A1 | 1/2015 | Azumi et al. |
| 2017/0102821 | A1* | 4/2017 | Lai ...................... G06F 3/04166 |
| 2019/0018523 | A1 | 1/2019 | Xu et al. |

FOREIGN PATENT DOCUMENTS

| EP | 3678004 | 7/2020 |
| KR | 10-2016-0130067 | 11/2016 |
| WO | 2011/071540 | 6/2011 |

* cited by examiner

*Primary Examiner* — Priyank J Shah
(74) *Attorney, Agent, or Firm* — H.C. Park & Associates, PLC

(57) ABSTRACT

A touch sensor and a display device including the same, in which the touch sensor includes a base layer including a first sensing area and a second sensing area, a sensing driving electrode extending along a first direction in the first sensing area and the second sensing area, a first sub-sensing electrode disposed in the first sensing area and extending along a second direction intersecting the first direction, a second sub-sensing electrode disposed in the second sensing area and extending along the second direction, a first common electrode disposed in the first sensing area, and a second common electrode disposed in the second sensing area. The first sub-sensing electrode and the second sub-sensing electrode are electrically connected to each other.

20 Claims, 12 Drawing Sheets

TOUCH SENSOR AND DISPLAY DEVICE HAVING THE SAME

CROSS REFERENCE TO RELATED APPLICATION

This application claims priority from and the benefit of Korean Patent Application No. 10-2020-0082315 filed on Jul. 3, 2020, which is hereby incorporated by reference for all purposes as if fully set forth herein.

BACKGROUND

Field

Embodiments of the invention relate generally to a touch sensor and a display device including the same.

Discussion of the Background

A display device has been developed in a direction of including an information input function in addition to an image display function. In general, the information input function of the display device may be implemented as an input sensing unit for receiving a touch of a user or a touch from a predetermined tool.

The input sensing unit, such as a touch sensor, is attached to one surface of a display panel implementing the image display function or formed integrally with the display panel to be used. The user may input information by pressing or touching the input sensing unit while viewing the image implemented on the display panel.

Recently, a plurality of sensing electrodes and a plurality of sensing lines are applied to the touch sensor in order to increase position recognition accuracy. However, in order to connect to the sensing lines, a circuit board of a large area including a plurality of input/output pins is required, and thus, there is a problem that a manufacturing cost of a touch sensor and a display device including the touch sensor is increased.

The above information disclosed in this Background section is only for understanding of the background of the inventive concepts, and, therefore, it may contain information that does not constitute prior art.

SUMMARY

Embodiments of the invention provide a touch sensor having a reduced manufacturing cost and a display device including the same.

Additional features of the inventive concepts will be set forth in the description which follows, and in part will be apparent from the description, or may be learned by practice of the inventive concepts.

An embodiment of the invention provides a touch sensor including a base layer including a first sensing area and a second sensing area, a sensing driving electrode extending along a first direction in the first sensing area and the second sensing area, a first sub-sensing electrode disposed in the first sensing area and extending along a second direction intersecting the first direction, a second sub-sensing electrode disposed in the second sensing area and extending along the second direction, a first common electrode disposed in the first sensing area, and a second common electrode disposed in the second sensing area. The first sub-sensing electrode and the second sub-sensing electrode are electrically connected to each other.

The touch sensor may further comprises a pad group disposed in a non-sensing area and including a plurality of pads, the base layer may include the non-sensing area adjacent to the first sensing area and the second sensing area, and the first sub-sensing electrode and the second sub-sensing electrode may be connected to the same first pad through a first sensing signal line.

The sensing driving electrode may be connected to the pad group through a driving signal line to receive a sensing driving signal, the first sub-sensing electrode and the sensing driving electrode may form a first capacitor, and the second sub-sensing electrode and the sensing driving electrode may form a second capacitor.

The first common electrode may be connected to the pad group through a first common signal line to receive a first common signal, the second common electrode may be connected to the pad group through a second common signal line to receive a second common signal, the first common electrode and the sensing driving electrode may form a third capacitor, the second common electrode and the sensing driving electrode may form a fourth capacitor, the first common electrode and the first sub-sensing electrode may form a fifth capacitor, and the second common electrode and the second sub-sensing electrode may form a sixth capacitor.

A capacitance of the first capacitor, a capacitance of the third capacitor, and a capacitance of the fifth capacitor may change according to a touch input generated in the first sensing area, and the first sub-sensing electrode may output a first sensing signal based on a change of the capacitance of the first capacitor, the capacitance of the third capacitor, and the capacitance of the fifth capacitor.

A capacitance of the second capacitor, a capacitance of the fourth capacitor, and a capacitance of the sixth capacitor may change according to a touch input generated in the second sensing area, and the second sub-sensing electrode may output a second sensing signal based on a change of the capacitance of the second capacitor, the capacitance of the fourth capacitor, and the capacitance of the sixth capacitor.

The first sensing signal and the second sensing signal may be provided to the same first pad through the first sensing signal line.

The touch sensor may further include an amplification circuit connected to the pad group, the amplification circuit may include an operational amplifier including a first input terminal, a second input terminal, and an output terminal, and a capacitor, the first input terminal may be connected to the first sensing signal line, the second input terminal may be connected to a ground, and the capacitor may be connected between the first input terminal and the output terminal.

The first common signal and the second common signal may be applied alternately with each other.

The first common signal and the second common signal may be signals which are different from each other.

The first capacitor and the second capacitor may have capacitance values which are different from each other.

The sensing driving electrode may include first sensing cells arranged along the first direction and a first connection portion electrically connecting the first sensing cells adjacent to each other.

Each of the first sub-sensing electrode and the second sub-sensing electrode may include second sensing cells arranged along the second direction and a second connection portion electrically connecting the second sensing cells adjacent to each other, and the second sensing cells may be disposed on the same layer as the first sensing cells.

The first common electrode may be disposed between the first sensing cells and the second sensing cells of the first sub-sensing electrode, and the second common electrode may be disposed between the first sensing cells and the second sensing cells of the second sub-sensing electrode.

The first common electrode and the second common electrode may be formed on the same layer as the first sensing cells and the second sensing cells.

The touch sensor may further include an insulating layer disposed on the first connection portion, the first common electrode, and the second common electrode. The second connection portion may be disposed on the insulating layer and may be connected to the second sensing cells by passing through the insulating layer.

Another embodiment of the invention provides a touch sensor comprising a base layer including first to p-th (p is a natural number equal to or greater than 3) sensing areas, a sensing driving electrode extending along a first direction in the first to p-th sensing areas, first to p-th sensing electrode groups disposed in correspondence with the first to p-th sensing areas, respectively, and first to p-th common electrodes disposed in correspondence with the first to p-th sensing areas, respectively. Each of the first to p-th sensing electrode groups includes first to n-th (n is a natural number equal to or greater than 2) sub-sensing electrodes extending along a second direction intersecting the first direction, and k-th (k is a natural number of equal to or less than n) sub-sensing electrodes of each of the first to p-th sensing electrode groups are electrically connected to each other.

The sensing driving electrode and a j-th (j is a natural number equal to or less than p) sensing electrode group among the first to p-th sensing electrode group may form a first capacitor, the sensing driving electrode and a j-th common electrode among the first to p-th common electrodes may form a second capacitor, and the j-th common electrode and the j-th sensing electrode group may form a third capacitor.

A capacitance of the first capacitor, a capacitance of the second capacitor, and a capacitance of the third capacitor may change according to a touch input generated in a j-th sensing area among the first to p-th sensing areas, and the j-th sensing electrode group may output a sensing signal based on a change of the capacitance of the first capacitor, the capacitance of the second capacitor, and the capacitance of the third capacitor.

Another embodiment of the invention provides a display device comprising a display panel including a light emitting element and an encapsulation layer covering the light emitting element, and a touch sensor disposed on the display panel. The touch sensor includes a base layer including a first sensing area and a second sensing area, a sensing driving electrode extending along a first direction in the first sensing area and the second sensing area, a first sub-sensing electrode disposed in the first sensing area and extending along a second direction intersecting the first direction, a second sub-sensing electrode disposed in the second sensing area and extending along the second direction, a first common electrode disposed in the first sensing area, and a second common electrode disposed in the second sensing area. The first sub-sensing electrode and the second sub-sensing electrode may be electrically connected to each other.

The present invention provides a touch sensor having a reduced manufacturing cost and a display device including the same.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
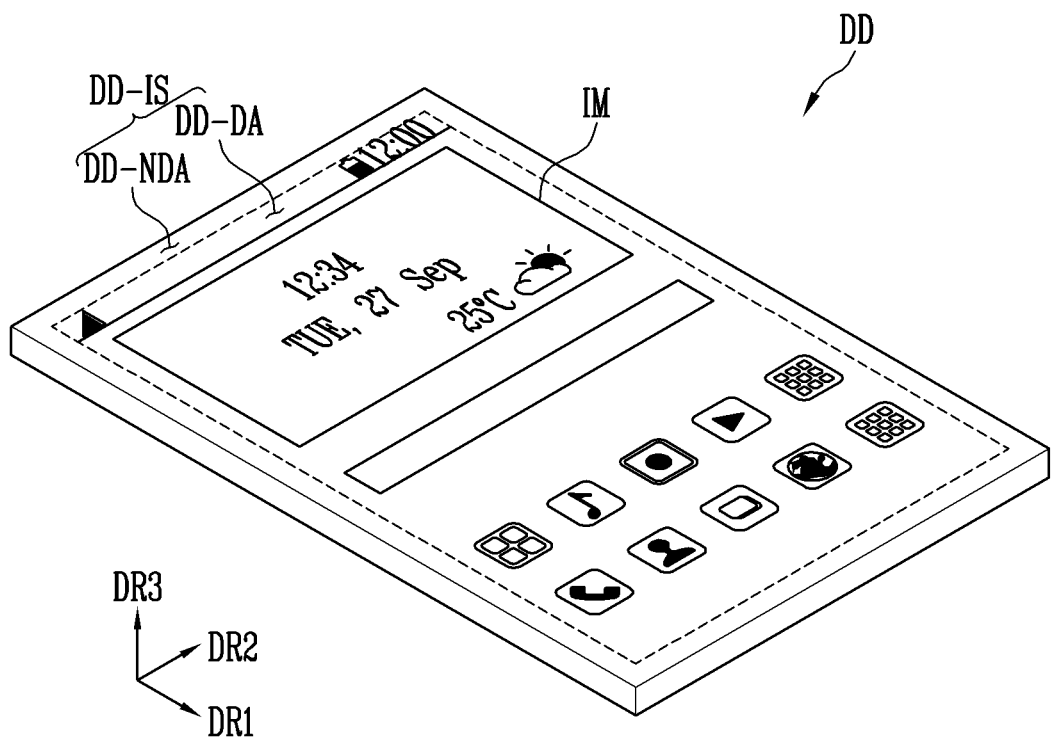
FIG. 1 is a perspective view illustrating a display device according to an exemplary embodiment of the invention.

In the following description, for the purposes of explanation, numerous specific details are set forth in order to provide a thorough understanding of various embodiments of the invention. As used herein "embodiments" are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device according to embodiments of the invention.

Referring to FIG. 1, the display device DD may display an image IM through a display surface DD-IS. The display surface DD-IS may be substantially parallel to a surface defined by a first direction DR1 and a second direction DR2. A normal direction of the display surface DD-IS, that is, a thickness direction of the display device DD, may be indicated by a third direction DR3.

A front surface (or an upper surface) and a back surface (or a lower surface) of each of members, layers, or units described below may be distinguished by the third direction DR3. However, the first to third directions DR1, DR2, and DR3 are merely examples, and the directions indicated by the first to third directions DR1, DR2, and DR3 may be converted into different directions as a relative concept.

The display device DD shown in FIG. 1 may have a planar display surface. The inventive concepts are not limited thereto, and the display device DD may have various types of display surfaces capable of displaying an image, such as a curved display surface or a stereoscopic display surface.

The display device DD may be a flexible display device. For example, the display device DD may be applied to a foldable display device, a bendable display device, a rollable display device, and the like. The inventive concepts are not limited thereto, and the display device DD may be a rigid display device.

As shown in FIG. 1, the display surface DD-IS of the display device DD may include a display area DD-DA in which the image IM is displayed and a non-display area DD-NDA adjacent to the display area DD-DA. The non-display area DD-NDA may be an area in which the image is not displayed. The non-display area DD-NDA may be disposed outside the display area DD-DA.

Figure 2A:
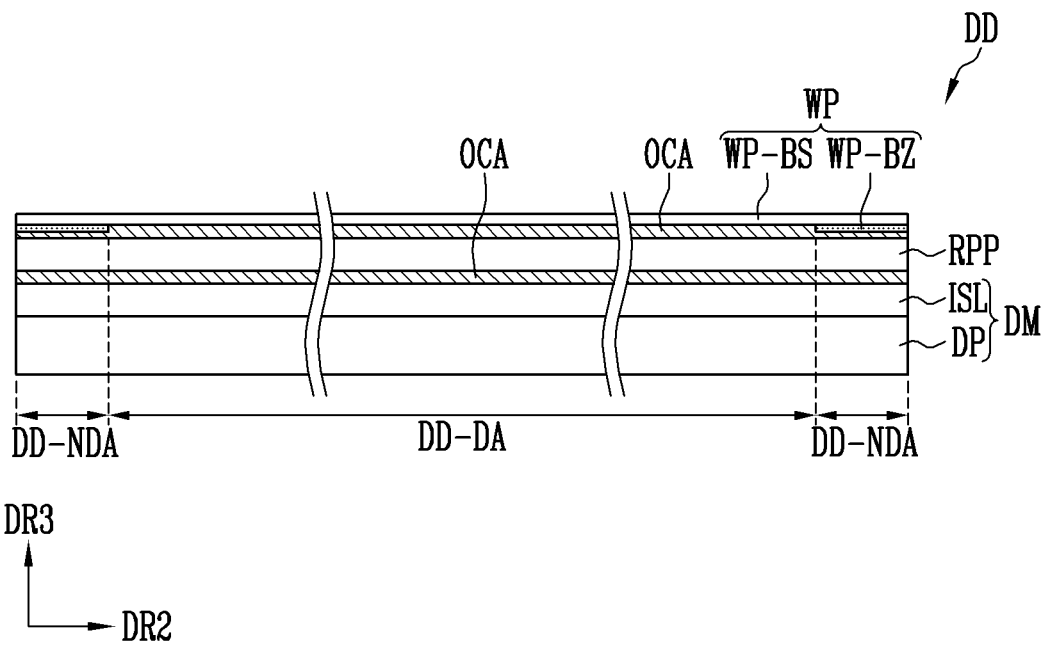
FIGS. 2A, 2B, and 2C are cross-sectional views schematically illustrating the display device according to an embodiment of the invention.
Figure 2B:
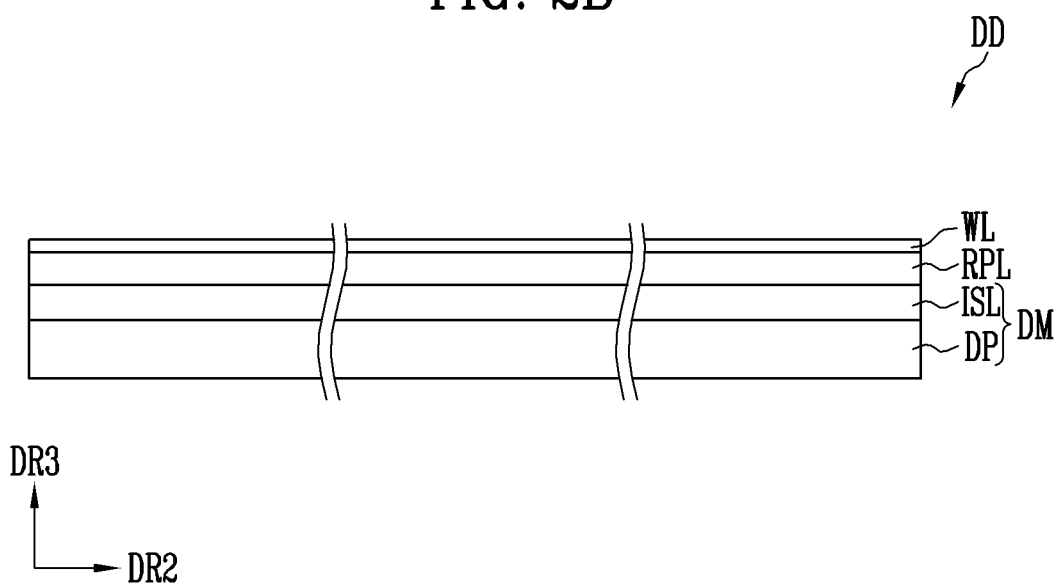
Figure 2C:
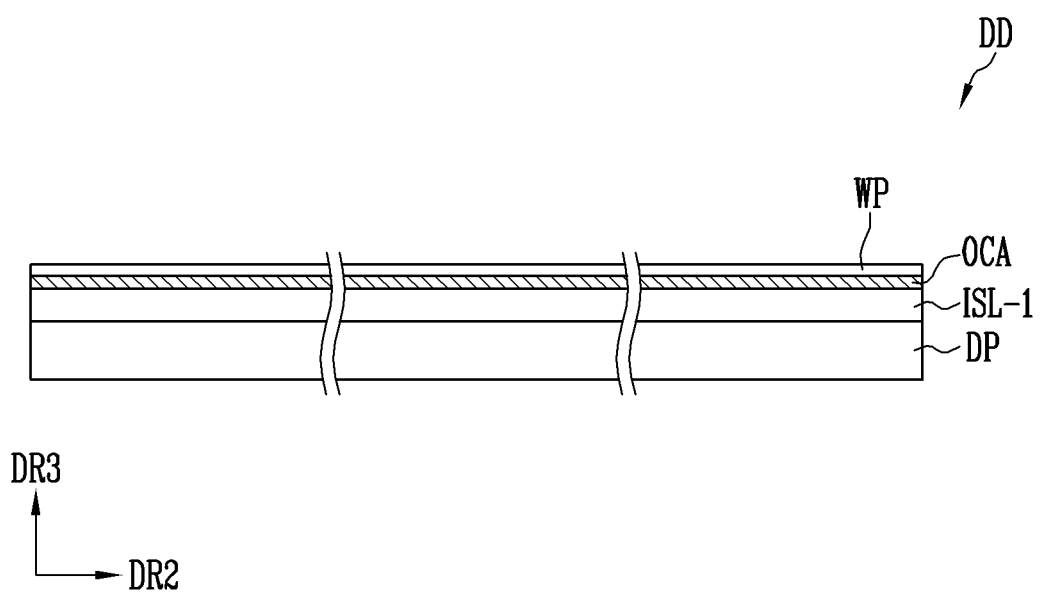

FIGS. 2A, 2B, and 2C are cross-sectional views schematically illustrating the display device according to embodiments of the invention.

FIGS. 2A to 2C are simply shown for illustrating a stack relationship of a functional panel and/or functional units configuring the display device DD.

Referring to FIGS. 2A to 2C, the display device DD may include a display panel DP, input sensing units ISL and ISL-1 (for example, a touch sensor), and window units WL and WP. The display device DD may further include an anti-reflection unit.

At least some configurations of the display panel DP, the input sensing units ISL and ISL-1, and the window units WL and WP may be formed by a continuous process, or at least some configurations may be combined with each other through an adhesive member. The adhesive member may include a common adhesive or an adhesive. The adhesive member shown in FIGS. 2A and 2C may be, for example, an optical transparent adhesive member OCA.

In an embodiment, the display panel DP may include a base layer, a circuit element, a display element, and an encapsulation layer.

The circuit element may be disposed on the base layer and may include a signal line, a pixel driving circuit, and the like.

In an embodiment, the display element may include a pixel definition film and a light emitting diode. The display element may be disposed on the circuit element and may be electrically connected to the circuit element. The light emitting diode may be an organic light emitting diode or an inorganic light emitting diode. The display element may configure a pixel.

The encapsulation layer may be disposed to cover and seal the display element. The encapsulation layer may include at least one organic film and at least one inorganic film. The encapsulation layer may be a base layer of the input sensing units ISL and ISL-1.

In an embodiment, the input sensing units ISL and ISL-1 may sense a touch or an input by an external medium, such as a hand or a pen, to the display surface DD-IS of the display device DD.

In FIGS. 2A to 2C, a corresponding configuration formed through a continuous process with another configuration among the input sensing units ISL and ISL-1 and the window units WL and WP is expressed as a "layer". A configuration combined with another configuration of the touch sensor and the window unit is expressed as a "panel".

The input sensing units ISL and ISL-1 and the window units WL and WP may be referred to as an input sensing panel, a window panel WP, an input sensing layer ISL, or a window layer WL according to presence or absence of the base layer.

In an embodiment, as shown in FIG. 2A, the display device DD may include the display panel DP, the input sensing layer ISL, the anti-reflection panel RPP, and the window panel WP.

In an embodiment, the input sensing layer ISL may be disposed directly on the display panel DP.

A display module DM may be defined by including the display panel DP and the input sensing layer ISL disposed on the display panel DP. The optical transparent adhesive member OCA may be disposed between the display module DM and the anti-reflection panel RPP, and between the anti-reflection panel RPP and the window panel WP.

The input sensing layer ISL may be disposed in the display panel DP or on the display panel DP.

In an embodiment, the display panel DP may be a light emitting display panel, but not particularly limited. For example, the display panel DP may be an organic light emitting display panel or a quantum dot light emitting display panel.

The anti-reflection panel RPP reduces a reflectance of external light incident from an upper side of the window panel WP. In an embodiment, the anti-reflection panel RPP may include a phase retarder and a polarizer. The phase retarder may be a film type or a liquid crystal coating type, and may include a $\lambda/2$ phase retarder and/or a $\lambda/4$ phase retarder. The polarizer may also be a film type or a liquid crystal coating type.

In an embodiment, the anti-reflection panel RPP may include color filters. The color filters have a predetermined arrangement. The arrangement of the color filters may be determined in consideration of an emission color of pixels included in the display panel DP. The anti-reflection panel RPP may further include a black matrix adjacent to the color filters.

In an embodiment, the window panel WP may include a base film WP-BS and a light blocking pattern WP-BZ. The base film WP-BS may include a glass substrate, a synthetic resin film, and/or the like. The base film WP-BS is not limited to a single layer. The base film WP-BS may include two or more films combined to each other by an adhesive member.

The light blocking pattern WP-BZ partially overlaps the base film WP-BS. The light blocking pattern WP-BZ may be disposed on a back surface of the base film WP-BS to define a bezel area of the display device DD, that is, the non-display area DD-NDA (refer to FIG. 1).

The window panel WP may further include a functional coating layer disposed on an upper surface of the base film WP-BS. The functional coating layer may include a finger prevention layer, an anti-reflection layer, a hard coating layer, and the like.

As shown in FIG. 2B, the display device DD may include the display panel DP, the input sensing layer ISL, the anti-reflection layer RPL, and the window layer WL. An adhesive member may be omitted from the display device DD, and the input sensing layer ISL, the anti-reflection layer RPL, and the window layer WL may be formed in a continuous process on the base surface provided to the display panel DP. The stack order of the input sensing layer ISL and the anti-reflection layer RPL may be changed.

As shown in FIG. 2C, the display device DD may not include a separate anti-reflection unit. In an embodiment, the display device DD may include the display panel DP, the input sensing layer ISL-1, and the window panel WP. Here, the input sensing layer ISL-1 may further have an anti-reflection function.

In FIGS. 2A to 2C, the input sensing unit is shown overlapping the entire display panel. However, this is merely an example, and the input sensing unit may overlap only a portion of the display area DD-DA, or may overlap only the non-display area DD-NDA. The input sensing unit may be a touch sensing panel that senses a touch of a user, or a fingerprint sensing panel that senses fingerprint information of a finger of the user. A pitch of the sensing electrodes and widths of the sensing electrodes described below may be changed according to a use of the input sensing unit.

Figure 3:
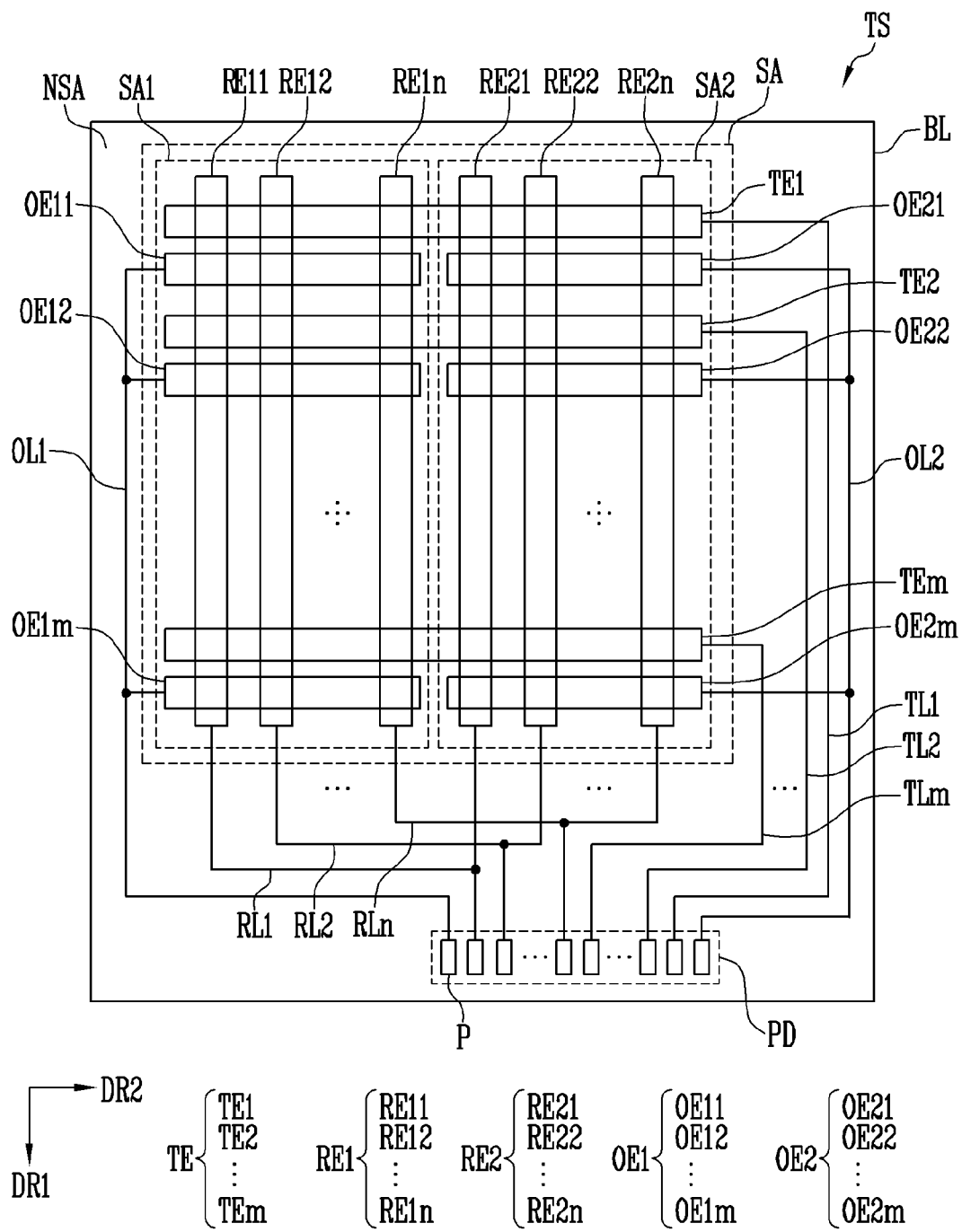
FIG. 3 is a plan view illustrating a touch sensor according to an embodiment of the invention.

FIG. 3 is a plan view illustrating a touch sensor according to embodiments of the invention. Here, the touch sensor may be the input sensing unit described with reference to FIGS. 2A to 2C.

Referring to FIG. 3, the touch sensor TS may include a base layer BL, a driving electrode group TE, a first sensing electrode group RE1, a second sensing electrode group RE2, a first common electrode group OE1, and a second common electrode group OE2. In addition, the touch sensor TS may include first to m-th (m is a natural number equal to or greater than 2) driving signal lines TL1 to TLm, first to n-th (n is a natural number equal to or greater than 2) sensing signal lines RL1 to RLn, a first common signal line OL1, a second common signal line OL2, and a pad group PD connected to the lines.

The base layer BL may be formed of a transparent insulating material formed of glass, quartz, ceramic, plastic, or the like. The base layer BL may be formed as a flexible substrate when the base layer BL is formed of plastic.

In an embodiment, the base layer BL may be an inorganic material. For example, the base layer BL may correspond to the uppermost layer of the encapsulation layer of the display panel DP of FIG. 1. In this case, the base layer BL may include a silicon nitride layer, a silicon oxynitride layer, a silicon oxide layer, or the like.

The base layer BL may include a sensing area SA that recognizes the touch of the user and a non-sensing area NSA that does not recognize the touch of the user. In the drawing, the sensing area SA and the non-sensing area NSA are shown as a quadrangle, but are not limited thereto.

The sensing area SA may overlap the display area of the display panel (not shown) which may be disposed on one surface of the base layer BL. For example, the sensing area SA may have the same shape as that of the display area. The non-sensing area NSA may overlap the non-display area of the display panel.

In an embodiment, the sensing area SA may include a first sensing area SA1 and a second sensing area SA2.

Each of the first sensing area SA1 and the second sensing area SA2 may have a quadrangular shape, but is not limited thereto. For example, each of the first sensing area SA1 and the second sensing area SA2 may have various shapes, such as a polygonal shape, a circular shape, or an elliptical shape.

In addition, as shown in FIG. 3, each of the first sensing area SA1 and the second sensing area SA2 may be arranged along the first direction DR1 and extend along the second direction DR2, but is not limited thereto. For example, each of the first sensing area SA1 and the second sensing area SA2 may be arranged along the second direction DR2 and extend along the first direction DR1.

In the sensing area SA, the driving electrode group TE, the first sensing electrode group RE1, the second sensing electrode group RE2, the first common electrode group OE1, and the second common electrode group OE2 may be provided.

In the non-sensing area NSA, the pad group PD including a plurality of pads P, the first to m-th driving signal lines TL1 to TLm, the first to n-th sensing signal lines RL1 to RLn, the first common signal line OL1, and the second common signal line OL2 may be provided. The driving electrode group TE, the first sensing electrode group RE1, the second sensing electrode group RE2, the first common electrode group OE1, and the second common electrode group OE2 may be respectively connected to the first to m-th driving signal lines TL1 to TLm, the first to n-th sensing signal lines RL1 to RLn, the first common signal line OL1, and the second common signal line OL2 to receive a signal through the pad group PD or to output a signal to the pad group PD.

The pad group PD may be connected to a touch sensing driver (not shown). The touch sensing driver may transfer a sensing driving signal, a first common signal, and a second common signal to the driving electrode group TE, the first common electrode group OE1, and the second common electrode group OE2 through the pad group PD. In addition, the touch sensing driver may receive a first sensing signal and a second sensing signal of the first sensing electrode group RE1 and the second sensing electrode group RE2 from the pad group PD, and may detect a touch input position based on the first sensing signal and the second sensing signal.

The driving electrode group TE may be disposed on the base layer BL, and may be disposed in the first sensing area SA1 and the second sensing area SA2. As an embodiment, the driving electrode group TE may include a plurality of sensing driving electrodes TE1 to TEm arranged along the second direction DR2 and extending along the first direction DR1. For example, the driving electrode group TE may include first to m-th sensing driving electrodes TE1 to TEm. Each of the first to m-th sensing driving electrodes TE1 to TEm may extend in the first sensing area SA1 and the second sensing area SA2, and may be integrally formed.

The first to m-th sensing driving electrodes TE1 to TEm of the driving electrode group TE may be connected to the first to m-th driving signal lines TL1 to TLm, respectively. The first to m-th sensing driving electrodes TE1 to TEm may be connected to different pads P of the pad group PD through the first to m-th driving signal lines TL1 to TLm. For example, the first sensing driving electrode TE1 may be connected to the first driving signal line TL1, and the second sensing driving electrode TE2 may be connected to the second driving signal line TL2. Accordingly, the driving electrode group TE may receive sensing driving signals from the pad group PD.

The first sensing electrode group RE1 may be disposed on the base layer BL, and may be disposed in the first sensing area SA1. As an embodiment, the first sensing electrode group RE1 may include a plurality of first sub-sensing electrodes RE11 to RE1n arranged along the first direction DR1 and extending along the second direction DR2.

The second sensing electrode group RE2 may be disposed on the base layer BL and may be disposed in the second sensing area SA2. As an embodiment, the second sensing electrode group RE2 may include a plurality of second sub-sensing electrodes RE21 to RE2n arranged along the first direction DR1 and extending along the second direction DR2.

Each of the first sensing electrode group RE1 and the second sensing electrode group RE2 may be connected to the first to n-th sensing signal lines RL1 to RLn. The first sensing electrode group RE1 and the second sensing electrode group RE2 may be electrically connected to the pad group PD through the first to n-th sensing signal lines RL1 to RLn.

As an embodiment, the first sub-sensing electrodes RE11 to RE1n of the first sensing electrode group RE1 and the second sub-sensing electrodes RE21 to RE2n of the second sensing electrode group RE2 may be electrically connected to each other. For example, the first sub-sensing electrode RE11 of the first sensing electrode group RE1 and the second sub-sensing electrode RE21 of the second sensing electrode group RE2 may be electrically connected to each other through the first sensing signal line RL1. The first sensing signal line RL1 connected to the first sub-sensing electrode RE11 and the second sub-sensing electrode RE21 may extend toward the pad group PD and may be connected to one pad P. That is, the first sub-sensing electrode RE11 and the second sub-sensing electrode RE21 may be connected to the same pad P.

Similarly, the first sub-sensing electrode RE12 of the first sensing electrode group RE1 and the second sub-sensing electrode RE22 of the second sensing electrode group RE2 may be electrically connected to each other through the second sensing signal line RL2. The second sensing signal line RL2 may be electrically connected to a pad P different from the pad P to which the first sensing signal line RL1 is connected.

FIG. 3 shows a structure in which the first sensing electrode group RE1 and the second sensing electrode group RE2 are individually formed. However, shapes of the first sensing electrode group RE1 and the second sensing electrode group RE2 are not limited thereto, and at least a portion of the first sensing electrode group RE1 and the second sensing electrode group RE2 may be integrally formed. For example, the first sensing electrodes RE11 and the second sensing electrodes electrically connected to each other may be integrally formed.

The first common electrode group OE1 may be disposed on the base layer BL and may be disposed in the first sensing area SA1. As an embodiment, the first common electrode group OE1 may include a plurality of first common electrodes OE11 to OE1m arranged along the second direction DR2 and extending along the first direction DR1. The first common electrodes OE11 to OE1m may be disposed between the sensing driving electrodes TE1 to TEm adjacent to each other. For example, the first common electrodes OE11 to OE1m and the sensing driving electrodes TE1 to TEm may be alternately disposed along the second direction DR2, but are not limited thereto.

The first common electrodes OE11 to OE1m may be connected to one first common signal line OL1 together. That is, the first common electrodes OE11 to OE1m may be electrically connected to each other. The first common electrodes OE11 to OE1m may be connected to the pad group PD through the first common signal line OL1.

According to an embodiment, the first common electrodes OE11 to OE1m may be integrally formed.

The second common electrode group OE2 may be disposed on the base layer BL and may be disposed in the second sensing area SA2. As an embodiment, the second common electrode group OE2 may include a plurality of second common electrodes OE21 to OE2m arranged along the second direction DR2 and extending along the first direction DR1. The second common electrodes OE21 to OE2m may be disposed between the sensing driving electrodes TE1 to TEm adjacent to each other. For example, the second common electrodes OE21 to OE2m and the sensing driving electrodes TE1 to TEm may be alternately disposed along the second direction DR2, but are not limited thereto.

The second common electrodes OE21 to OE2m may be connected to one second common signal line OL2 together. That is, the second common electrodes OE21 to OE2m may be electrically connected to each other. The second common electrodes OE21 to OE2m may be connected to the pad group PD through the second common signal line OL2. Here, a pad P of the pad group PD to which the second common signal line OL2 is connected may be different from a pad P to which the first common signal line OL1 is connected.

According to an embodiment, the second common electrodes OE21 to OE2m may be integrally formed.

The above-described driving electrode group TE, the first sensing electrode group RE1, the second sensing electrode group RE2, the first common electrode group OE1, and the second common electrode group OE2 may be formed of a transparent conductive material. For example, the transparent conductive material may be indium tin oxide (ITO), indium zinc oxide (IZO), indium tin zinc oxide (ITZO), carbon nano tube, silver nanowire (AgNW), graphene, or the like, but is not limited thereto. In some embodiments, at least some of the driving electrode group TE, the first sensing electrode group RE1, the second sensing electrode group RE2, the first common electrode group OE1, and the second common electrode group OE2 may include a metal or an alloy. For example, the metal may be gold (Au), silver (Ag), aluminum (Al), molybdenum (Mo), chromium (Cr), titanium (Ti), nickel (Ni), neodymium (Nd), copper (Cu), platinum (Pt), or the like, but is not limited thereto.

As described above, the first sensing electrode group RE1 of the first sensing area SA1 and the second sensing electrode group RE2 of the second sensing area SA2 may be electrically connected to each other. Since the first sub-sensing electrodes RE11 to RE1n and the second sub-sensing electrodes RE21 to RE2n corresponding to each other are connected to the same pad, the number of pads P connected to each of the first sub-sensing electrodes RE11 to RE1n and the second sub-sensing electrodes RE21 to RE2n may be reduced. For example, when the first sub-sensing electrodes RE11 to RE1n and the second sub-sensing electrodes RE21 to RE2n are connected to different pads P, a total of 2×n pads P are required. However, when the first sub-sensing electrodes RE11 to RE1n and the second sub-sensing electrodes RE21 to RE2n corresponding to each other are connected to the same pad P, a total of n pads P are required. Therefore, the number of pads P required to connect the first sensing electrode group RE1 and the second sensing electrode group RE2 to the pad group PD may be reduced by half, and a size of the touch sensing driver (not shown) or the circuit board connected to the pad group PD may be reduced. Thus, a cost for manufacturing the touch sensor TS may be reduced.

As described above, the first common electrode group OE1 may be disposed in the first sensing area SA1, and the second common electrode group OE2 may be disposed in the second sensing area SA2. Common signals provided to the first common electrode group OE1 and the second common electrode group OE2 may be alternately provided or may be different signals. Accordingly, the touch sensor TS may detect a touch position by distinguishing sensing signals provided from the first sensing electrode group RE1 and the second sensing electrode group RE2.

Hereinafter, a touch position detection operation of the touch sensor TS is described in detail with reference to FIGS. 4 to 6B.

Figure 4:
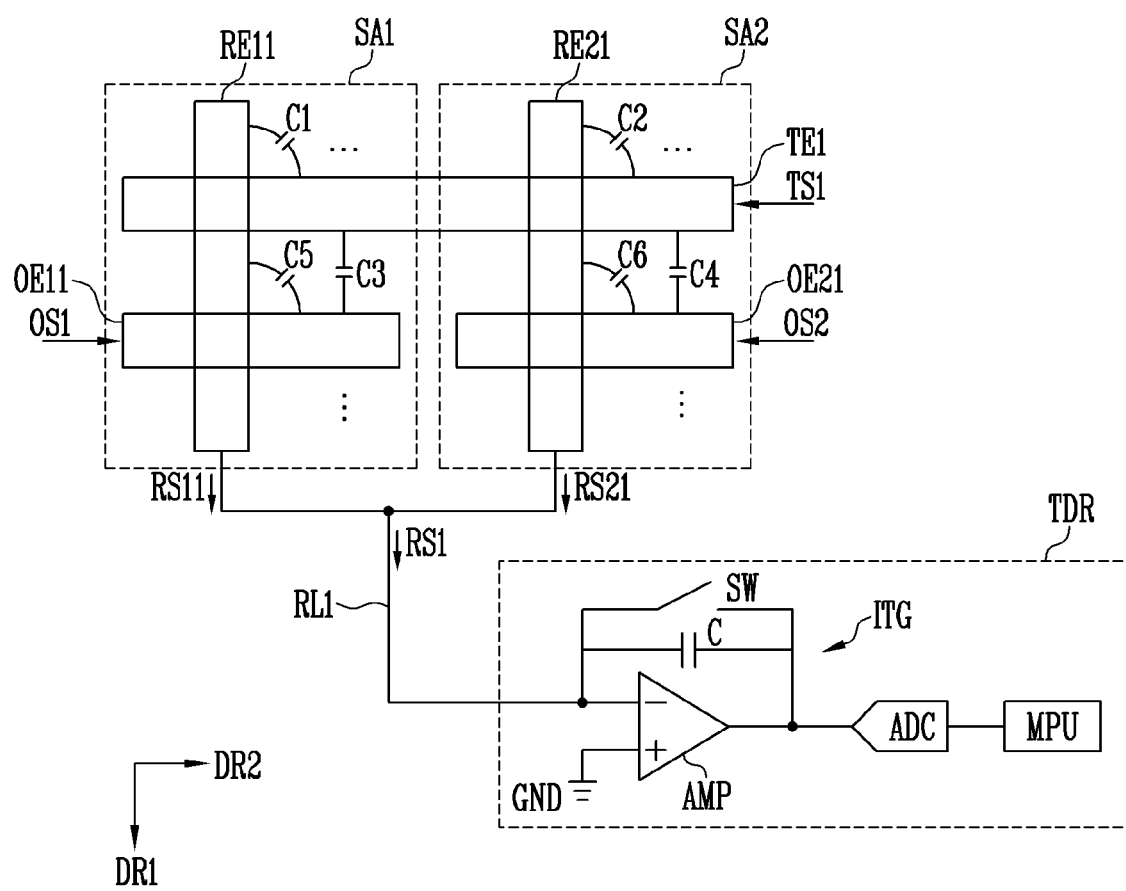
FIG. 4 is a diagram illustrating a touch position detection operation of the touch sensor of FIG. 3.

FIG. 4 is a diagram illustrating the touch position detection operation of the touch sensor of FIG. 3.

For convenience of description, FIG. 4 shows only the first sensing driving electrode TE1, the first sub-sensing electrode RE11, the second sub-sensing electrode RE21, the first common electrode OE11, and the second common electrode OE21 of the touch sensor TS of FIG. 3.

Referring to FIGS. 3 and 4, the first sensing driving electrode TE1 may be disposed in the first sensing area SA1 and the second sensing area SA2. The first sub-sensing electrode RE11 and the first common electrode OE11 may be disposed in the first sensing area SA1. The second sub-sensing electrode RE21 and the second common electrode OE21 may be disposed in the second sensing area SA2.

The first sensing driving electrode TE1 may receive a first sensing driving signal TS1. The first sensing driving signal TS1 may be a signal having a pulse shape and may be a signal provided a predetermined number of times during a certain period.

The first common electrode OE11 may receive a first common signal OS1, and the second common electrode OE21 may receive a second common signal OS2. As an embodiment, the first common signal OS1 and the second common signal OS2 may be signals provided alternately with each other. For example, after the first common signal OS1 is provided during a first period, the second common signal OS2 may be provided during the first period. The touch sensor TS may detect the touch input generated in the first sensing area SA1 during a period in which the first common signal OS1 is provided, and may detect the touch input generated in the second sensing area SA2 during a period in which the second common signal OS2 is provided.

According to an embodiment, the first common signal OS1 and the second common signal OS2 may be simultaneously provided. In this case, the first common signal OS1 and the second common signal OS2 may be different signals. For example, the second common signal OS2 may be a signal in which a high level and a low level of the first common signal OS1 are inverted. As another example, the second common signal OS2 may be a signal of which a phase of the first common signal OS1 is delayed.

As an embodiment, the first sensing driving signal TS1, the first common signal OS1, and the second common signal OS2 described above may be signals provided from a touch sensing driver TDR connected to the pad group PD, but are not limited thereto. For example, at least one of the first sensing driving signal TS1, the first common signal OS1, and the second common signal OS2 may be a signal provided through a separate external circuit or driver.

The first sensing driving electrode TE1, the first sub-sensing electrode RE11, the second sub-sensing electrode RE21, the first common electrode OE11, and the second common electrode OE21 may form a capacitor with each other. A capacitance of the capacitor may change according to a touch input generated in the first sensing area SA1 and the second sensing area SA2, and the first sub-sensing electrode RE11 and the second sub-sensing electrode RE21 may output a first sensing signal RS11 and a second sensing signal RS21 based on a change of the capacitance.

For example, the first sensing driving electrode TE1 may form a first capacitor C1 with the first sub-sensing electrode RE11 and may form a second capacitor C2 with the second sub-sensing electrode RE21. The first sensing driving electrode TE1 may form a third capacitor C3 with the first common electrode OE11 and may form a fourth capacitor C4 with the second common electrode OE21. In addition, the first sub-sensing electrode RE11 may form a fifth capacitor C5 with the first common electrode OE11 and the second sub-sensing electrode RE21 may form a sixth capacitor C6 with the second common electrode OE21.

Figure 5:
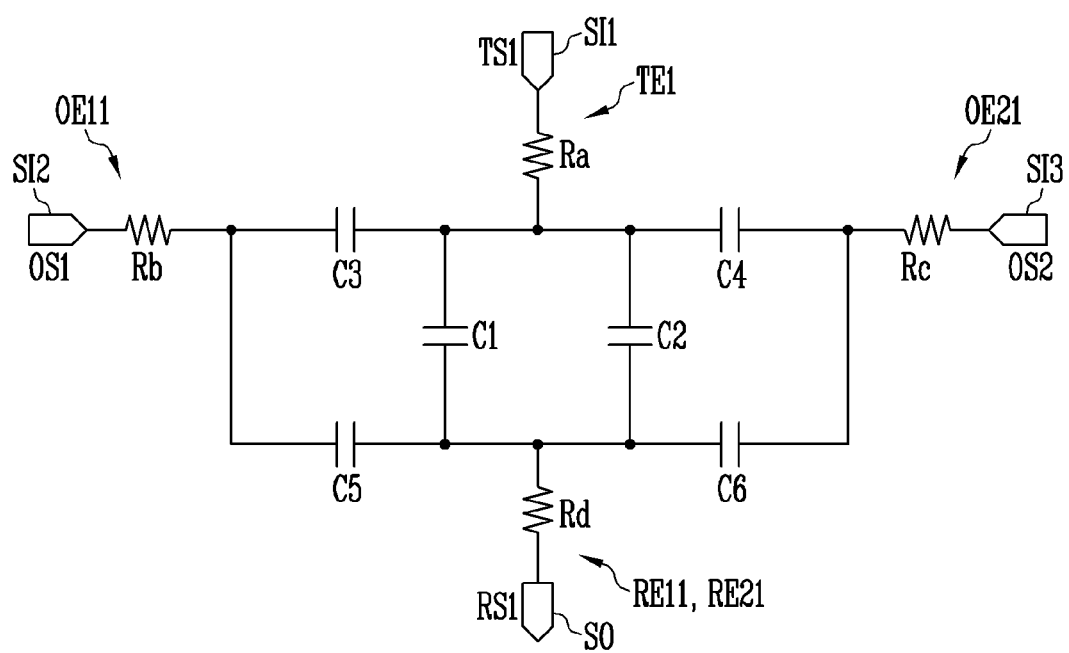
FIG. 5 is an equivalent circuit diagram of the touch sensor shown in FIG. 4.
Figure 6A:
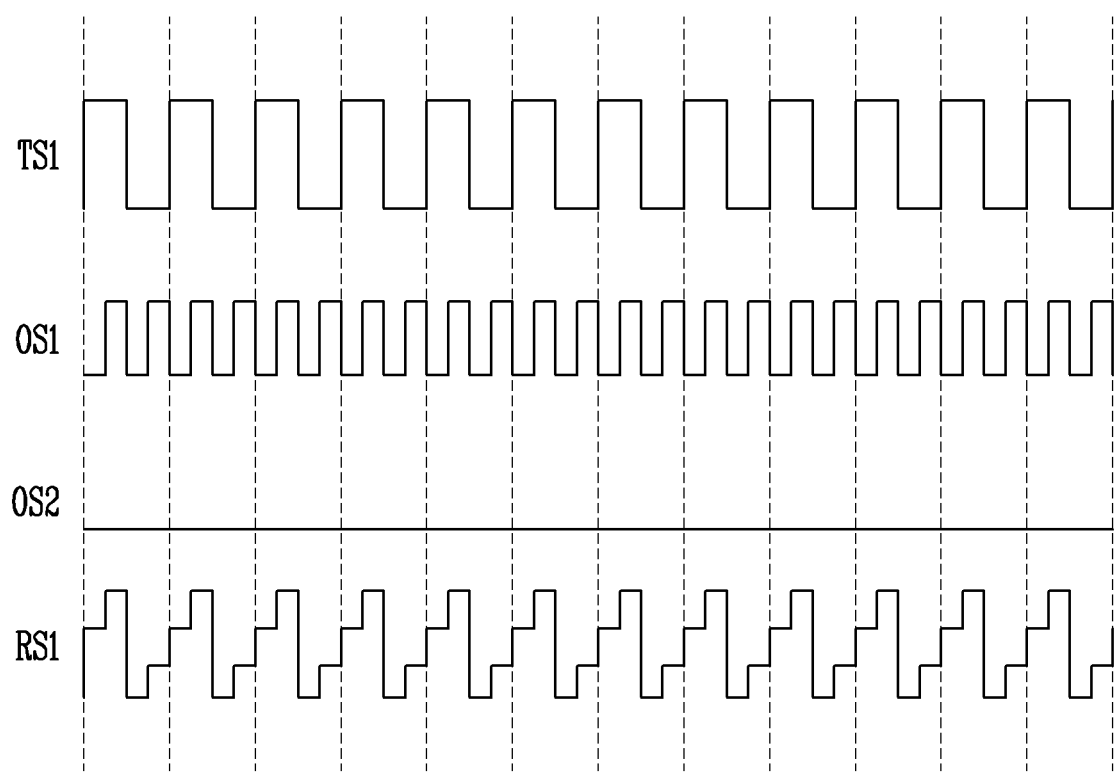
FIG. 6A is a waveform diagram illustrating an example of a method of driving the touch sensor shown in FIG. 4.
Figure 6B:
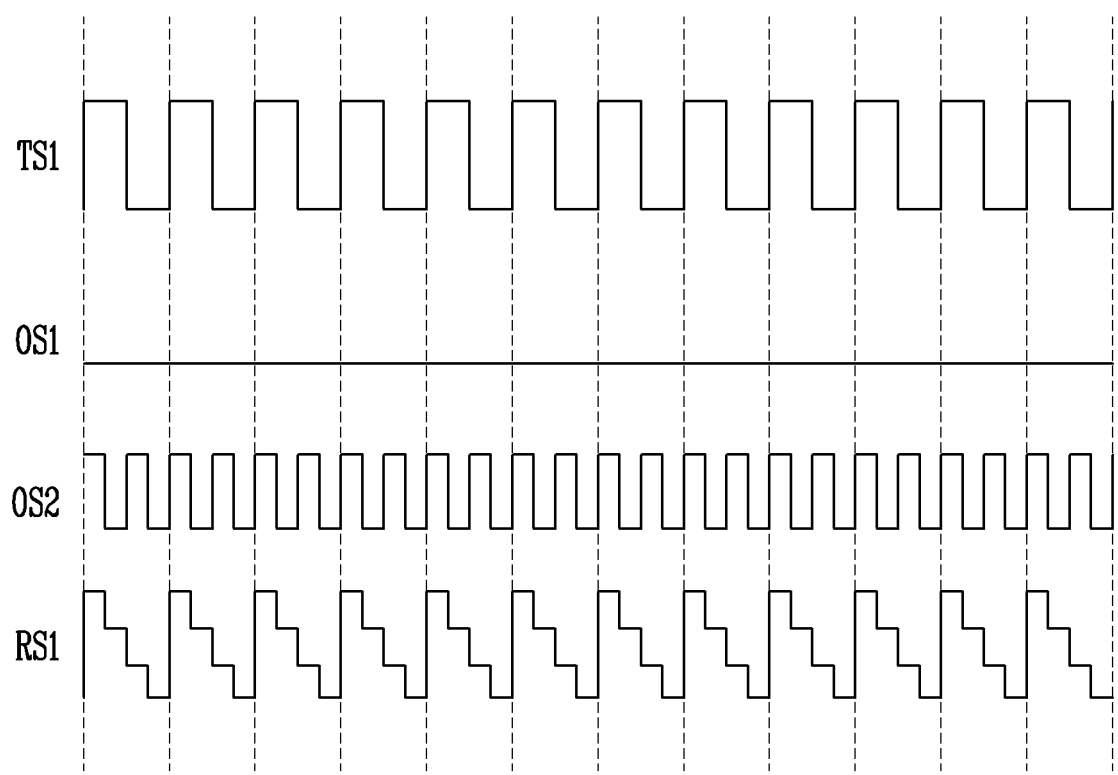
FIG. 6B is a waveform diagram illustrating another example of a method of driving the touch sensor shown in FIG. 4.

FIG. 5 is an equivalent circuit diagram of the touch sensor shown in FIG. 4. FIG. 6A is a waveform diagram illustrating an example of a method of driving the touch sensor shown in FIG. 4. FIG. 6B is a waveform diagram illustrating another example of a method of driving the touch sensor shown in FIG. 4.

Referring to FIG. 5 in conjunction with FIG. 4, an equivalent circuit of the first sensing driving electrode TE1, the first sub-sensing electrode RE11, the second sub-sensing electrode RE21, the first common electrode OE11, and the second common electrode OE21 may include a first signal input terminal SI1, a second signal input terminal SI2, a third signal input terminal SI3, and a signal output terminal SO, and may include first to fourth resistors Ra, Rb, Rc, and Rd and first to sixth capacitors C1, C2, C3, C4, C5, and C6 connected between the first signal input terminal SI1, the second signal input terminal SI2, the third signal input terminal SI3, and the signal output terminal SO.

The first to fourth resistors Ra, Rb, Rc, and Rd may be internal resistances of respective electrodes. For example, the first resistor Ra may be the internal resistance of the first sensing driving electrode TE1, the second resistor Rb may be the internal resistance of the first common electrode OE11, the third resistor Rc may be the internal resistance of the second common electrode OE21, and the fourth resistance Rd may be the internal resistance of the first sub-sensing electrode RE11 and the second sub-sensing electrode RE21.

The first sensing driving electrode TE1 may receive a first sensing driving signal TS1 through the first signal input terminal SI1. The first common electrode OE11 may receive the first common signal OS1 through the second signal input terminal SI2. The second common electrode OE21 may receive the second common signal OS2 through the third signal input terminal SI3. The first sub-sensing electrode RE11 and the second sub-sensing electrode RE21 may output the sensing signal RS1 through the signal output terminal SO.

The first capacitor C1 may be formed between the first sensing driving electrode TE1 and the first sub-sensing electrode RE11, and the second capacitor C2 may be formed between the first sensing driving electrode TE1 and the second sub-sensing electrode RE21. As an embodiment, the capacitance of the first capacitor C1 and the capacitance of the second capacitor C2 may be the same, but are not limited thereto. As another example, the capacitance of the first capacitor C1 may be different from the capacitance of the second capacitor C2.

The third capacitor C3 may be formed between the first sensing driving electrode TE1 and the first common electrode OE11, and the fourth capacitor C4 may be formed between the first sensing driving electrode TE1 and the second common electrode OE21. As an embodiment, the capacitance of the third capacitor C3 and the capacitance of the fourth capacitor C4 may be the same, but are not limited thereto. As another example, the capacitance of the third capacitor C3 may be different from the capacitance of the fourth capacitor C4.

The fifth capacitor C5 may be formed between the first common electrode OE11 and the first sub-sensing electrode RE11, and the sixth capacitor C6 may be formed between the second common electrode OE21 and the second sub-sensing electrode RE21. As an embodiment, the capacitance of the fifth capacitor C5 and the capacitance of the sixth capacitor C6 may be the same, but are not limited thereto. As another example, the capacitance of the fifth capacitor C5 may be different from the capacitance of the sixth capacitor C6.

The sensing signal RS1 output through the signal output terminal SO may change in correspondence with the signals input to the first signal input terminal SI1, the second signal input terminal SI2, and the third signal input terminal SI3.

Referring to FIGS. 6A and 6B additionally, the first sensing driving signal TS1 input to the first signal input terminal SI1 may be a signal input during a constant period at a predetermined cycle. A basic waveform of the sensing signal RS1 may be determined corresponding to the first sensing driving signal TS1.

The first common signal OS1 input to the second signal input terminal SI2 and the second common signal OS2 input to the third signal input terminal SI3 may be selectively input signals. For example, FIG. 6A shows a case where the first common signal OS1 is input and the second common signal OS2 is not input, and FIG. 6B shows a case where the first common signal OS1 is not input and the second common signal OS2 is input.

As an embodiment, as shown in FIGS. 6A and 6B, the first common signal OS1 and the second common signal OS2 may be signals having different waveforms. Accordingly, the sensing signal RS1 when only the first common signal OS1 is supplied may be different from the sensing signal RS2 when only the second common signal OS2 is supplied. When a touch input occurs, the touch sensor TS may analyze the sensing signal RS1, may distinguish the sensing signal RS1 when the first common signal OS1 is supplied and the sensing signal RS1 when the second common signal OS2 is supplied, and may determine a touch position. However, the first common signal OS1 and the second common signal OS2 are not limited to the above.

According to an embodiment, the first common signal OS1 and the second common signal OS2 may be signals including the same pulse, and may be alternately input signals. In this case, the touch sensor TS may determine the touch position through an input time point of the first common signal OS1 and the second common signal OS2 and a waveform of the output sensing signal RS1. For example, when the sensing signal RS1 output at the time point when the first common signal OS1 is input is a pulse having a shape similar to that of the first sensing driving signal TS1 without an influence of the first common signal OS1, it may be determined that the sensing signal RS1 is a signal that is not generated in the first sensing area SA1.

Referring to FIGS. 3 and 4 again, when the touch input occurs in the first sensing area SA1, the capacitance of the first capacitor C1, the third capacitor C3, and the fifth capacitor C5 may change. The first sub-sensing electrode RE11 may output the first sensing signal RS11 based on the change of the capacitance of the first capacitor C1, the third capacitor C3, and the fifth capacitor C5.

Similarly, when the touch input occurs in the second sensing area SA2, the capacitance of the second capacitor C2, the fourth capacitor C4, and the sixth capacitor C6 may change. The second sub-sensing electrode RE21 may output the second sensing signal RS21 based on the change of the capacitance of the second capacitor C2, the fourth capacitor C4, and the sixth capacitor C6.

The first sensing signal RS11 and the second sensing signal RS21 output from the first sub-sensing electrode RE11 and the second sub-sensing electrode RE21 may be transferred to the pad group PD of FIG. 3 through the first sensing signal line RL1 to detect the touch position as the sensing signal RS1. The touch sensing driver TDR may be electrically connected to the pad group PD, and the touch sensing driver TDR may detect the touch input and the touch position based on the sensing signal RS1.

The touch sensing driver TDR may include an amplification circuit ITG, an analog-to-digital converter ADC, and a processor MPU, as shown in FIG. 4.

The amplification circuit ITG may include an operational amplifier AMP and a capacitor C.

The operational amplifier AMP may include a first input terminal, a second input terminal, and an output terminal. For example, the first input terminal may be an inverted input terminal, and the second input terminal may be a non-inverted input terminal.

The first input terminal of the operational amplifier AMP may be connected to the first sensing signal line RL1. The sensing signal RS1 output from the first sub-sensing electrode RE11 and the second sub-sensing electrode RE21 may be input to the first input terminal. The second input terminal of the operational amplifier AMP may be a reference potential terminal, and may be connected to reference power. For example, the reference power may be ground power GND. The capacitor C may be connected between the first input terminal and the output terminal of the operational amplifier AMP. Accordingly, the operational amplifier AMP may amplify the sensing signal RS1 input to the first input terminal and output an amplified sensing signal RS1 to the output terminal. According to an embodiment, the operational amplifier AMP may further include a reset switch SW connected in parallel with the capacitor C between the first input terminal and the output terminal.

In the above-described example, the amplification circuit ITG is implemented in an inverted amplification circuit form, but is not limited thereto. In another embodiment, the amplification circuit ITG may be implemented in a form of a non-inverted amplification circuit.

The analog-to-digital converter ADC may be connected to the output terminal of the amplification circuit ITG. The analog-to-digital converter ADC may convert an input analog signal to a digital signal.

The processor MPU may perform signal processing on a conversion signal (digital signal) of the analog-to-digital converter ADC, comprehensively analyze a signal processing result, and detect the touch input. For example, the processor MPU may be implemented as a micro-processor unit. In this case, a memory required for driving the processor MPU may be additionally provided in the touch sensing driver TDR. A configuration of the processor MPU is not limited thereto.

Hereinafter, other embodiments of the touch sensor are described. In the following embodiments, the same configurations as the previously described embodiment are denoted to by the same reference numerals, description thereof is omitted or simplified, and a difference is mainly described.

Figure 7:
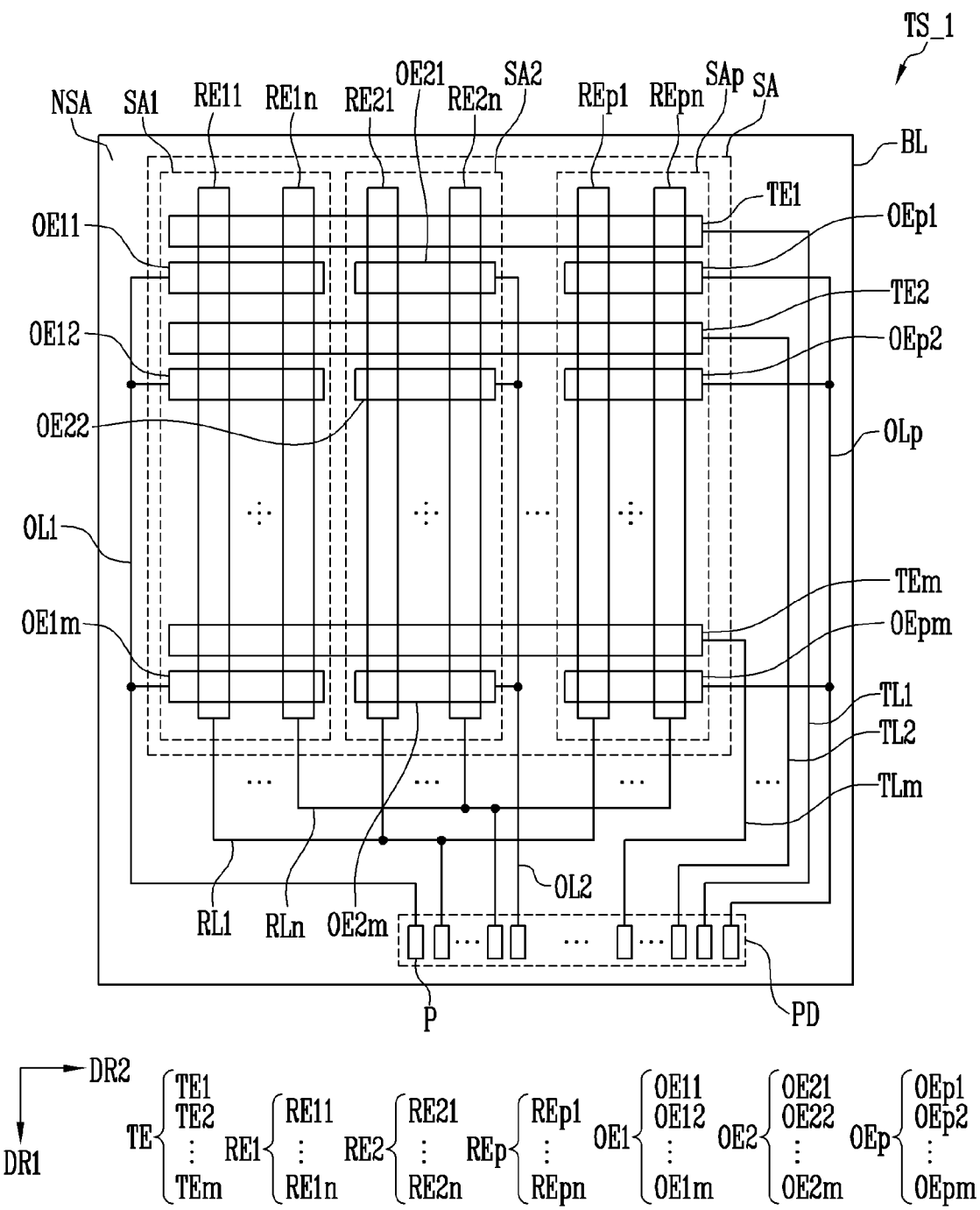
FIG. 7 is a plan view illustrating a touch sensor according to another embodiment of the invention.

FIG. 7 is a plan view illustrating a touch sensor according to another embodiment of the disclosure. The touch sensor of FIG. 6 includes two sensing areas, but the touch sensor of FIG. 7 is different from the touch sensor of FIG. 6 in that the touch sensor of FIG. 7 includes three or more sensing areas.

Referring to FIG. 7, the touch sensor TS_1 may include the base layer BL, the driving electrode group TE, the first to p-th (p is a natural number equal to or greater than 3) sensing electrode groups RE1 to REp, and the first to p-th common electrode groups OE1 to OEp. In addition, the touch sensor TS_1 may include the first to m-th driving signal lines TL1 to TLm, the first to n-th sensing signal lines RL1 to RLn, the first to p-th common signal lines OL1 to OLp, and the pad group PD connected to the lines.

The base layer BL may include the sensing area SA that recognizes the touch of the user and the non-sensing area NSA that does not recognize the touch of the user. As an embodiment, the sensing area SA may include first to p-th sensing areas SA1 to SAp.

The driving electrode group TE, the first to p-th sensing electrode groups RE1 to REp, and the first to p-th common electrode groups OE1 to OEp may be disposed in the sensing area SA.

In the non-sensing area NSA, the pad group PD including the plurality of pads P, the first to m-th driving signal lines TL1 to TLm, the first to n-th sensing signal lines RL1 to RLn, and first to p-th common signal lines OL1 to OLp may be provided. The driving electrode group TE, the first to p-th sensing electrode groups RE1 to REp, the first to p-th common electrode groups OE1 to OEp may be respectively connected to the first to m-th driving signal lines TL1 to TLm, the first to n-th sensing signal lines RL1 to RLn, first to p-th common signal lines OL1 to OLp to receive a signal through the pad group PD or to output a signal to the pad group PD.

The driving electrode group TE may be disposed on the base layer BL, and may be disposed in the first to p-th sensing areas SA1 to SAp. As an embodiment, the driving electrode group TE may include the plurality of sensing driving electrodes TE1 to TEm arranged along the second direction DR2 and extending along the first direction DR1.

The first to p-th sensing electrode groups RE1 to REp may be disposed on the base layer BL, and may be disposed in the first to p-th sensing areas SA1 to SAp, respectively. As an embodiment, each of the first to p-th sensing electrode groups RE1 to REp may include a plurality of sub-sensing electrodes arranged along the first direction DR1 and extending along the second direction DR2. For example, the first sensing electrode group RE1 may include a plurality of first sub-sensing electrodes RE11 to RE1n, and the p-th sensing electrode group REp may include a plurality of p-th sub-sensing electrodes REp1 to REpn.

The first to p-th sensing electrode groups RE1 to REp may be connected to the first to n-th sensing signal lines RL1 to RLn, respectively. The first to p-th sensing electrode groups RE1 to REp may be electrically connected to the pad group PD through the first to n-th sensing signal lines RL1 to RLn.

As an embodiment, sub-sensing electrodes corresponding to each other among the plurality of sub-sensing electrodes included in the first to p-th sensing electrode groups RE1 to REp may be electrically connected to each other. For example, first to p-th sub-sensing electrodes RE11, RE21, . . . , and REp1 disposed in a first column of each of the first to p-th sensing electrode groups RE1 to REp may be electrically connected to each other through the first sensing signal line RL1, and first to p-th sub-sensing electrodes RE1n, RE2n, . . . , and REpn disposed in an n-th column of each of the first to p-th sensing electrode groups RE1 to REp may be electrically connected to each other through the n-th sensing signal line RLn.

The first to p-th common electrode groups OE1 to OEp may be disposed on the base layer BL, and may be disposed in the first to p-th sensing areas SA1 to SAp, respectively. As an embodiment, the first to p-th common electrode groups OE1 to OEp may include a plurality of common electrodes arranged along the second direction DR2 and extending along the first direction DR1. For example, the first common electrode group OE1 may include a plurality of first common electrodes OE11 to OE1m, and the p-th common electrode group OEp may include a plurality of p-th common electrodes OEp1 to OEpm.

The first to p-th common electrode groups OE1 to OEp may be connected to the first to p-th common signal lines OL1 to OLp, respectively. For example, the first common electrodes OE11 to OE1m of the first common electrode group OE1 may be connected to the first common signal line OL1, and the p common electrodes OEp1 to OEpm of the p-th common electrode group OEp may be connected to the p-th common signal line OLp.

Hereinafter, a method of detecting a touch of the touch sensor TS_1 and a method of driving the touch sensor TS_1 are substantially the same or similar to those of the embodiment of FIG. 3, and thus, any repetitive description is omitted.

As described above, when the sub-sensing electrodes disposed in correspondence with each other in each of the sensing areas SA1 to SAp are electrically connected to each other and connected to the same pad through the first to n-th sensing signal lines RL1 to RLn, the number of pads P respectively connected to the first to p-th sensing electrode groups RE1 to REp may be reduced. For example, when the sub-sensing electrodes included in the first to p-th sensing electrode groups RE1 to REp are connected to different pads P, a total of p×n pads P are required. However, when the first to p-th sub-sensing electrodes corresponding to each other are connected to the same pad P, a total of n pads P are required. Therefore, the number of pads P required to connect the first to p-th sensing electrode groups RE1 to REp to the pad group PD may be reduced to half, and a size of the touch sensing driver (not shown) or the circuit board connected to the pad group PD may be reduced. Thus, a cost for manufacturing the touch sensor TS_1 may be further reduced.

Figure 8:
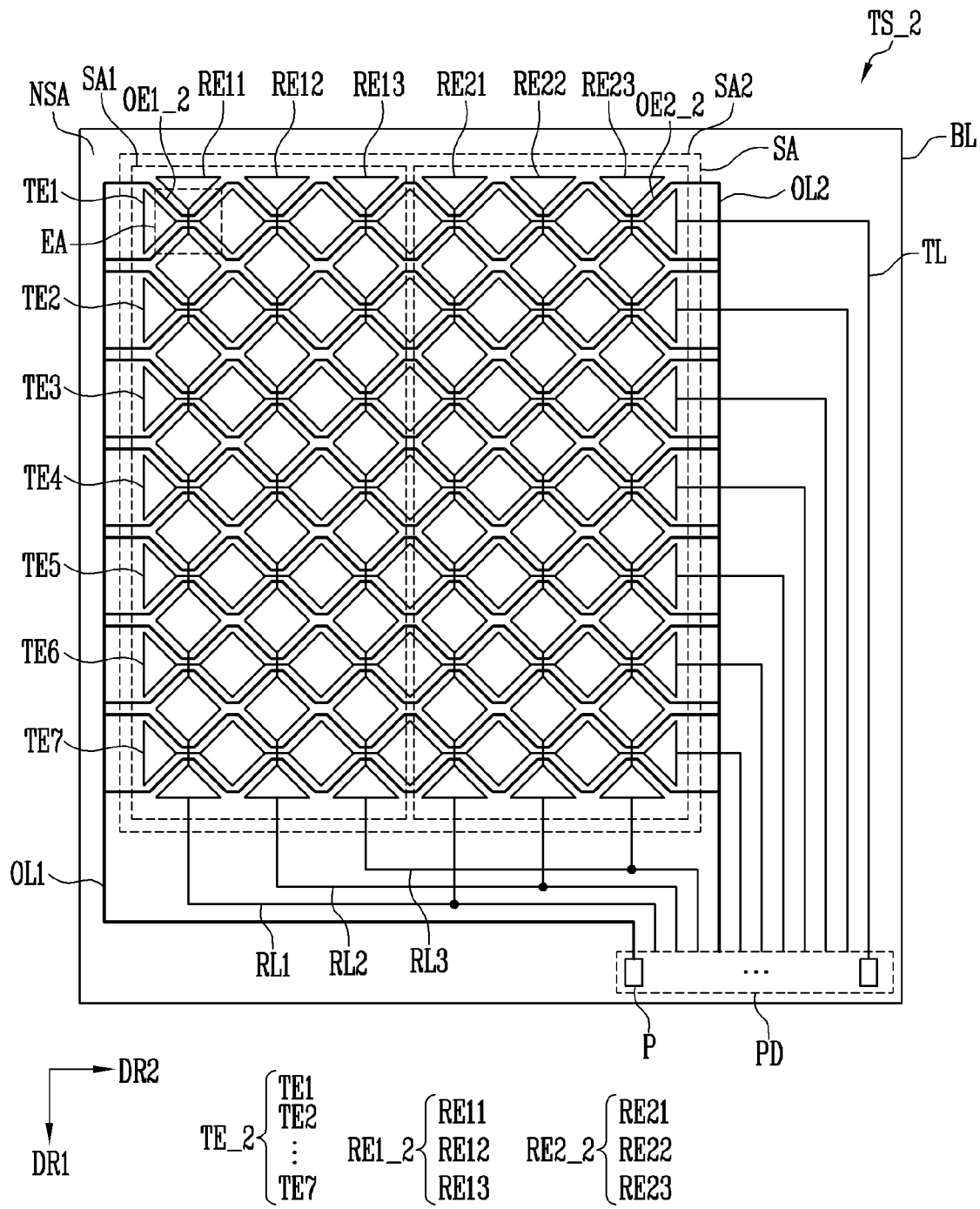
FIG. 8 is a plan view illustrating a touch sensor according to still another embodiment of the invention.
Figure 9:
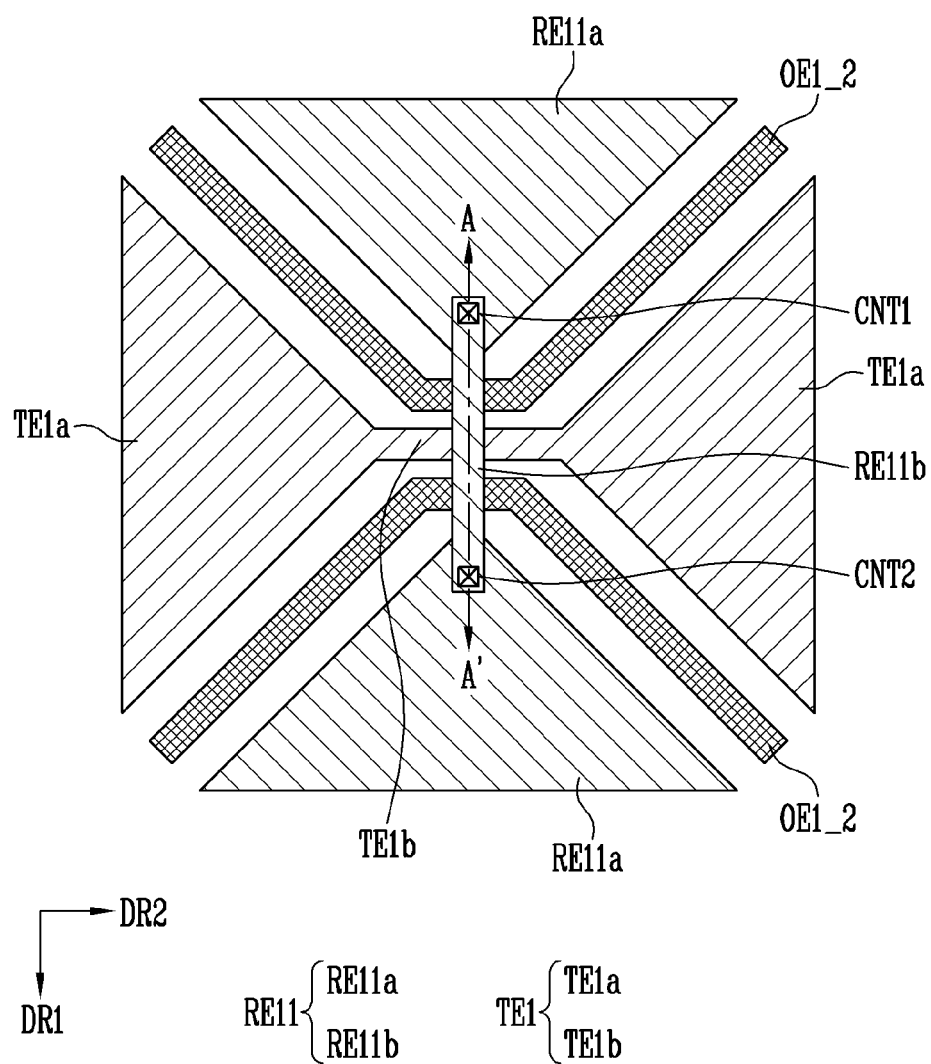
FIG. 9 is an enlarged plan view of an EA region of FIG. 8.
Figure 10:
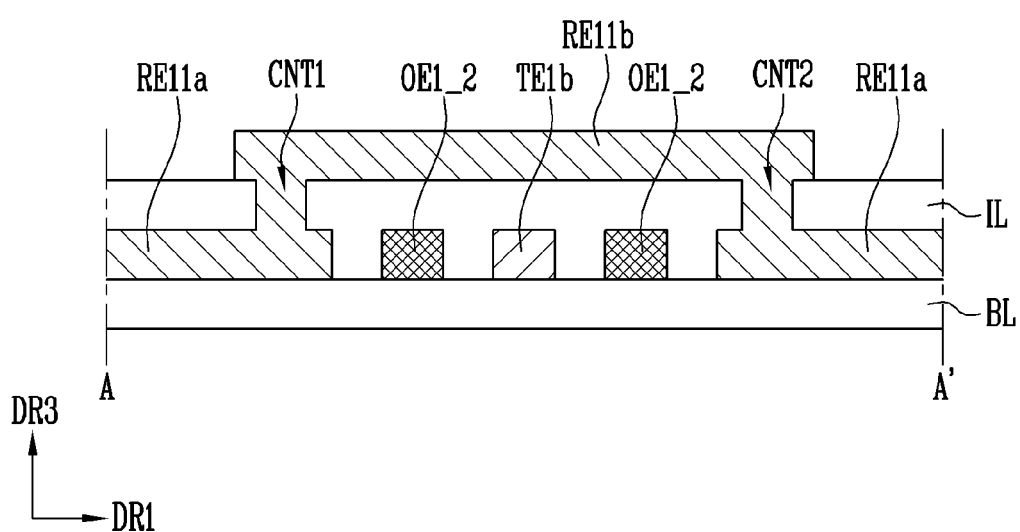
FIG. 10 is a cross-sectional view taken along a line A-A' of FIG. 9.

FIG. 8 is a plan view illustrating a touch sensor according to still another embodiment of the invention. FIG. 9 is an enlarged plan view of an EA region of FIG. 8. FIG. 10 is a cross-sectional view taken along a line A-A' of FIG. 9.

The embodiment of FIGS. 8 to 10 is different from the embodiment of FIG. 3 in that shapes of a driving electrode group TE_2, a first sensing electrode group RE1_2, a second sensing electrode group RE2_2, a first common electrode group OE1_2, and a second common electrode group OE2_2 are different.

Referring to FIGS. 8 to 10, the touch sensor TS_2 may include the driving electrode group group TE_2, the first sensing electrode group RE1_2, the second sensing electrode group RE2_2, the first common electrode group OE1_1, and the second common electrode group OE2_2.

For convenience of description, FIG. 8 illustrates a structure in which the driving electrode group TE_2 includes seven sensing driving electrodes and each of the first sensing electrode group RE1_2 and the second sensing electrode group RE2_2 includes three sub-sensing electrodes, but the disclosure is not limited thereto, and a greater number of sensing driving electrodes and sub-sensing electrodes may be disposed.

The driving electrode group TE_2 may include first to seventh driving electrodes TE1 to TE7 arranged along the second direction DR2 and extending along the direction DR1 in the first sensing area SA1 and the second sensing area SA2.

Each of the first to seventh sensing driving electrodes TE1 to TE7 may include a plurality of sensing cells arranged along the first direction DR1. For example, the first sensing driving electrode TE1 may include a plurality of first sensing cells TE1a arranged along the first direction DR1. The first sensing cells TE1a may have a planar rhombus shape, but are not limited thereto. In addition, the first sensing driving electrode TE1 may include a first connection portion TE1b electrically connecting the first sensing cells TE1a adjacent to each other. The first sensing cells TE1a and the first connection portion TE1b may be integrally formed, but are not limited thereto.

The first sensing electrode groups RE1_2 may include first sub-sensing electrodes RE11, RE12, and RE13 arranged along the first direction DR1 and extending along the second direction DR2 in the first sensing area SA1.

The second sensing electrode group RE2_2 may include second sub-sensing electrodes RE21, RE22, and RE23 arranged along the first direction DR1 and extending along the second direction DR2 in the second sensing area SA2.

The first sub-sensing electrodes RE11, RE12, and RE13 of the first sensing electrode group RE1_2 and the second sub-sensing electrodes RE21, RE22, and RE23 of the second sensing electrode group RE2_2 corresponding to each other may be electrically connected to each other. For example, the first sub-sensing electrode RE11 and the second sub-sensing electrode RE21 may be electrically connected to each other by the first sensing signal line RL1 and may be connected to the same pad P.

Each of the first sub-sensing electrodes RE11, RE12, and RE13 and each of the second sub-sensing electrodes RE21, RE22, and RE23 include a plurality of sensing cells arranged along the second direction DR2. For example, the first sub-sensing electrode RE11 may include a plurality of second sensing cells RE11a arranged along the second direction DR2. The second sensing cells RE11a may have a planar rhombus shape, but are not limited thereto. In addition, the first sub-sensing electrode RE11 may include a second connection portion RE11b electrically connecting the second sensing cells RE11a adjacent to each other.

The first common electrode group OE1_2 may be disposed in the first sensing area SA1, and may be disposed between the first sensing cells TE1a and the second sensing cells RE11a of the first sub-sensing electrodes RE11, RE12, and RE13.

The second common electrode group OE2_2 may be disposed in the second sensing area SA2, and may be disposed between the first sensing cells TE1a and the second sensing cells of the second sub-sensing electrodes RE21, RE22, and RE23.

As an embodiment, the first sensing cells TE1a and the second sensing cells RE11a may be disposed on the same layer. In addition, as shown in FIG. 10, the first connection portion TE1b may be disposed on the same layer as the second sensing cells RE11a.

According to an embodiment, the first common electrode group OE1_2 and the second common electrode group OE2_2 may be disposed on the same layer as the first sensing cells TE1a and the second sensing cells RE11a. For example, the first common electrode group OE1_2 may be disposed on the same layer as the first sensing cells TE1a, the second sensing cells RE11a, and the first connection portion TE1b. However, the disposition of the first common electrode group OE1_2 and the second common electrode group OE2_2 is not limited thereto. For example, the first common electrode group OE1_2 and the second common electrode group OE2_2 may be disposed on different layers, or both of the first common electrode group OE1_2 and the second common electrode group OE2_2 may be disposed on a layer different from that of the first sensing cells TE1a and the second sensing cells RE11a.

According to an embodiment, the second connection portion RE11b connecting the second sensing cells RE11a adjacent to each other may be disposed on a layer different from that of the second sensing cells RE11a. For example, as shown in FIG. 10, the insulating layer IL may be disposed on the first sensing cells TE1a and the second sensing cells RE11a, and the second connection portion RE11b may be disposed on the insulating layer IL and may electrically connect the second sensing cells RE11a adjacent to each other through a first contact hole CNT1 and a second contact hole CNT2 passing through the insulating layer IL. The second connection portion RE11b may be formed of a material different from that of the second sensing cells RE11a, but is not limited thereto.

Hereinafter, a method of detecting a touch of the touch sensor TS_2 and a method of driving the touch sensor TS_2 are substantially the same or similar to those of the embodiments described above, and thus, any repetitive description is omitted.

As in the present embodiment, when the first sub-sensing electrodes RE11 to RE13 and the second sub-sensing electrodes RE21 to RE23 corresponding to each other are electrically connected to each other and connected to the same pad P, the number of pads P required to connect the first sensing electrode group RE1_2 and the second sensing electrode group RE2_2 to the pad group PD may be reduced to half, and a size of the touch sensing driver (not shown) or the circuit board connected to the pad group PD may be reduced. Thus, a cost for manufacturing the touch sensor TS_2 may be further reduced.

In addition, when the driving electrode group TE_2 of the touch sensor TS_2 is formed to include the first sensing cells and the first connection portion, and each of the first sensing electrode group RE1_2 and the second sensing electrode group RE2_2 are formed to include the second sensing cells and the second connection portion, the first sensing cells and the second sensing cells may be disposed on the same layer. Therefore, the touch sensor TS_2 having a smaller thickness may be manufactured, and light transmittance of the touch sensor TS_2 may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A touch sensor comprising:
   a base layer including a first sensing area and a second sensing area;
   a sensing driving electrode extending along a first direction in the first sensing area and the second sensing area;
   a first sub-sensing electrode disposed in the first sensing area and extending along a second direction intersecting the first direction;
   a second sub-sensing electrode disposed in the second sensing area and extending along the second direction;
   a first common electrode disposed in the first sensing area; and
   a second common electrode disposed in the second sensing area,
   wherein the first sub-sensing electrode and the second sub-sensing electrode are electrically connected to each other.

2. The touch sensor according to claim 1, further comprising a pad group disposed in a non-sensing area and including a plurality of pads,
   wherein:
   the base layer includes the non-sensing area adjacent to the first sensing area and the second sensing area; and
   the first sub-sensing electrode and the second sub-sensing electrode are connected to the same first pad through a first sensing signal line.

3. The touch sensor according to claim 2, wherein:
   the sensing driving electrode is connected to the pad group through a driving signal line to receive a sensing driving signal;
   the first sub-sensing electrode and the sensing driving electrode form a first capacitor; and
   the second sub-sensing electrode and the sensing driving electrode form a second capacitor.

4. The touch sensor according to claim 3, wherein:
   the first common electrode is connected to the pad group through a first common signal line to receive a first common signal;

the second common electrode is connected to the pad group through a second common signal line to receive a second common signal;

the first common electrode and the sensing driving electrode form a third capacitor;

the second common electrode and the sensing driving electrode form a fourth capacitor;

the first common electrode and the first sub-sensing electrode form a fifth capacitor; and the second common electrode and the second sub-sensing electrode form a sixth capacitor.

5. The touch sensor according to claim 4, wherein:
a capacitance of the first capacitor, a capacitance of the third capacitor, and a capacitance of the fifth capacitor change according to a touch input generated in the first sensing area; and the first sub-sensing electrode outputs a first sensing signal based on a change of the capacitance of the first capacitor, the capacitance of the third capacitor, the capacitance of and the fifth capacitor.

6. The touch sensor according to claim 5, wherein:
a capacitance of the second capacitor, a capacitance of the fourth capacitor, and a capacitance of the sixth capacitor change according to a touch input generated in the second sensing area; and the second sub-sensing electrode outputs a second sensing signal based on a change of the capacitance of the second capacitor, the capacitance of the fourth capacitor, and the capacitance of the sixth capacitor.

7. The touch sensor according to claim 6, wherein the first sensing signal and the second sensing signal are provided to the same first pad through the first sensing signal line.

8. The touch sensor according to claim 7, further comprising
an amplification circuit connected to the pad group, wherein:
the amplification circuit includes an operational amplifier including a first input terminal, a second input terminal, and an output terminal, and a capacitor;
the first input terminal is connected to the first sensing signal line;
the second input terminal is connected to a ground; and
the capacitor is connected between the first input terminal and the output terminal.

9. The touch sensor according to claim 4, wherein the first common signal and the second common signal are applied alternately with each other.

10. The touch sensor according to claim 4, wherein the first common signal and the second common signal are signals which are different from each other.

11. The touch sensor according to claim 3, wherein the first capacitor and the second capacitor have capacitance values which are different from each other.

12. The touch sensor according to claim 1, wherein the sensing driving electrode includes first sensing cells arranged along the first direction and a first connection portion electrically connecting the first sensing cells adjacent to each other.

13. The touch sensor according to claim 12, wherein:
each of the first sub-sensing electrode and the second sub-sensing electrode includes second sensing cells arranged along the second direction and a second connection portion electrically connecting the second sensing cells adjacent to each other; and
the second sensing cells are disposed on the same layer as the first sensing cells.

14. The touch sensor according to claim 13, wherein:
the first common electrode is disposed between the first sensing cells and the second sensing cells of the first sub-sensing electrode; and
the second common electrode is disposed between the first sensing cells and the second sensing cells of the second sub-sensing electrode.

15. The touch sensor according to claim 13, wherein the first common electrode and the second common electrode are formed on the same layer as the first sensing cells and the second sensing cells.

16. The touch sensor according to claim 13, further comprising an insulating layer disposed on the first connection portion, the first common electrode, and the second common electrode,
wherein the second connection portion is disposed on the insulating layer and is connected to the second sensing cells by passing through the insulating layer.

17. A touch sensor comprising:
a base layer including first to p-th (p is a natural number equal to or greater than 3) sensing areas;
a sensing driving electrode extending along a first direction in the first to p-th sensing areas;
first to p-th sensing electrode groups disposed in correspondence with the first to p-th sensing areas, respectively; and
first to p-th common electrodes disposed in correspondence with the first to p-th sensing areas, respectively,
wherein:
each of the first to p-th sensing electrode groups includes first to n-th (n is a natural number equal to or greater than 2) sub-sensing electrodes extending along a second direction intersecting the first direction; and
k-th (k is a natural number of equal to or less than n) sub-sensing electrodes of each of the first to p-th sensing electrode groups are electrically connected to each other.

18. The touch sensor according to claim 17, wherein:
the sensing driving electrode and a j-th (j is a natural number equal to or less than p) sensing electrode group among the first to p-th sensing electrode group form a first capacitor;
the sensing driving electrode and a j-th common electrode among the first to p-th common electrodes form a second capacitor; and
the j-th common electrode and the j-th sensing electrode group form a third capacitor.

19. The touch sensor according to claim 18, wherein:
a capacitance of the first capacitor, a capacitance of the second capacitor, and a capacitance of the third capacitor change according to a touch input generated in a j-th sensing area among the first to p-th sensing areas; and
the j-th sensing electrode group outputs a sensing signal based on a change of the capacitance of the first capacitor, the capacitance of the second capacitor, and the capacitance of the third capacitor.

20. A display device comprising:
a display panel including a light emitting element and an encapsulation layer covering the light emitting element; and
a touch sensor disposed on the display panel,
wherein:
the touch sensor comprises:
a base layer including a first sensing area and a second sensing area;
a sensing driving electrode extending along a first direction in the first sensing area and the second sensing area;

a first sub-sensing electrode disposed in the first sensing area and extending along a second direction intersecting the first direction;
a second sub-sensing electrode disposed in the second sensing area and extending along the second direction;
a first common electrode disposed in the first sensing area; and
a second common electrode disposed in the second sensing area; and
the first sub-sensing electrode and the second sub-sensing electrode are electrically connected to each other.

* * * * *